(12) United States Patent
Son et al.

(10) Patent No.: US 12,144,195 B2
(45) Date of Patent: Nov. 12, 2024

(54) DISPLAY DEVICE

(71) Applicant: Samsung Display Co., LTD., Yongin-si (KR)

(72) Inventors: Yong Duck Son, Seongnam-si (KR); Jeong Hwan Kim, Hwaseong-si (KR); Sun Park, Suwon-si (KR); Min Chul Shin, Seoul (KR); Jin Wook Jeong, Asan-si (KR); Myung Koo Hur, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 292 days.

(21) Appl. No.: 17/560,356

(22) Filed: Dec. 23, 2021

(65) Prior Publication Data

US 2022/0209177 A1 Jun. 30, 2022

(30) Foreign Application Priority Data

Dec. 24, 2020 (KR) .................... 10-2020-0183429

(51) Int. Cl.
| | | |
|---|---|---|
| H01L 51/52 | (2006.01) | |
| H01L 51/56 | (2006.01) | |
| H10K 50/842 | (2023.01) | |
| H10K 50/844 | (2023.01) | |
| H10K 59/124 | (2023.01) | |

(Continued)

(52) U.S. Cl.
CPC ....... *H10K 50/8426* (2023.02); *H10K 50/844* (2023.02); *H10K 59/124* (2023.02); *H10K 71/00* (2023.02); *H10K 59/126* (2023.02); *H10K 71/851* (2023.02)

(58) Field of Classification Search
CPC ............ H10K 50/8426; H10K 59/124; H10K 59/8722
See application file for complete search history.

(56) References Cited

U.S. PATENT DOCUMENTS 9,356,256 B2 * 5/2016 Choi .................... H10K 50/844
10,840,478 B2 11/2020 Han et al.
(Continued)

FOREIGN PATENT DOCUMENTS

KR 10-2016-0114220 10/2016
KR 10-2017-0128683 11/2017
(Continued)

OTHER PUBLICATIONS

Machine translation, Choi, Korean Pat. Pub. No. KR20200037765A, translation date: Sep. 16, 2024, Espacenet, all pages. (Year: 2024).*
(Continued)

*Primary Examiner* — Victoria K. Hall
(74) *Attorney, Agent, or Firm* — KILE PARK REED & HOUTTEMAN PLLC

(57) ABSTRACT

A display device includes a substrate that includes a display area and a non-display area; a mask support that is disposed in the non-display area of the substrate; a sealant that is disposed in the non-display area of the substrate and is disposed between the mask support and the display area; an insulating layer that is disposed between the sealant and the mask support; and a plurality of grooves that are formed by removing at least a part of the insulating layer.

20 Claims, 17 Drawing Sheets

(51) Int. Cl.
*H10K 71/00* (2023.01)
*H10K 59/126* (2023.01)

(56) References Cited

U.S. PATENT DOCUMENTS

| | | | |
|---|---|---|---|
| 10,998,391 B2 | 5/2021 | Bae et al. | |
| 11,394,006 B2 | 7/2022 | Choi et al. | |
| 12,016,194 B2 * | 6/2024 | Park | H10K 50/844 |
| 2016/0204380 A1* | 7/2016 | Tsai | H10K 50/844 |
| | | | 257/40 |
| 2019/0165312 A1* | 5/2019 | Bae | G09G 3/20 |
| 2020/0106045 A1* | 4/2020 | Han | H10K 59/124 |
| 2021/0234122 A1* | 7/2021 | Choi | H10K 59/8731 |
| 2021/0376291 A1* | 12/2021 | Park | H10K 59/88 |
| 2022/0393610 A1 | 12/2022 | Choi et al. | |

FOREIGN PATENT DOCUMENTS

| | | | | |
|---|---|---|---|---|
| KR | 10-2019-0064254 | | 6/2019 | |
| KR | 10-2052740 | | 12/2019 | |
| KR | 10-2020-0025582 | | 3/2020 | |
| KR | 10-2020-0028915 | | 3/2020 | |
| KR | 10-2020-0030163 | | 3/2020 | |
| KR | 10-2020-0037025 | | 4/2020 | |
| KR | 10-2020-0037765 | | 4/2020 | |
| KR | 1020200037765 A | * | 4/2020 | G09F 9/33 |

OTHER PUBLICATIONS

Machine translation, Request for the Submission of an Opinion, Korean Pat. App. No. 10-2020-0183429, Korean Intellectual Property Office, Jun. 20, 2024, all pages. (Year: 2024).*

Machine translation, Written Opinion, Korean Pat. App. No. 10-2020-0183429, Korean Intellectual Property Office, Aug. 20, 2024, all pages. (Year: 2024).*

Korean Office Action for Korean Patent Application No. 10-2020-0183429, dated Jun. 20, 2024.

* cited by examiner

DISPLAY DEVICE

CROSS-REFERENCE TO RELATED APPLICATION(S)

This application claims priority to and the benefit of Korean Patent Application No. 10-2020-0183429 under 35 U.S.C. § 119, filed in the Korean Intellectual Property Office (KIPO) on Dec. 24, 2020, the entire contents of which are incorporated herein by reference.

BACKGROUND

1. Technical Field

The disclosure relates to a display device, and more particularly, it relates to a display device with a minimized bezel.

2. Description of the Related Art

An emissive display device may have a bendable characteristic when a flexible substrate such as a plastic film is used instead of using a rigid substrate such as glass. For example, the flexible emissive display device includes a plastic film, and a pixel circuit and a light emitting diode formed on the plastic film.

In a manufacturing process of the flexible emissive display device, the plastic film is disposed on a hard carrier substrate such as glass, the pixel circuit and the light emitting diode are formed on the plastic film, and the carrier substrate and the plastic film are separated from each other. The carrier substrate and the plastic film are provided in a mother board form so that flexible display devices can be simultaneously manufactured, and are separated into individual flexible display devices by cutting before or after separating the carrier substrate and the plastic film.

However, during the cutting process, physical damage occurs from the outside of the flexible display device, forming cracks, and the cracks propagate into the display area from the outside through the inorganic layer to form an internal moisture permeable path, thereby causing defects such as pixel shrinkage.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a display device that can prevent propagation of cracks during the cutting of the display device where a size of a bezel is reduced or minimized.

A display device according to an embodiment may include a substrate that includes a display area and a non-display area; a mask support that is disposed in the non-display area of the substrate; a sealant that is disposed in the non-display area of the substrate and is disposed between the mask support and the display area; an insulating layer that is disposed between the sealant and the mask support; and a plurality of grooves that are formed by removing at least a part of the insulating layer.

The display device may further include a metal layer that is disposed between the insulating layer and the substrate.

The plurality of groove may include first grooves that do not overlap the metal layer in a plan view; and second grooves that overlap the metal layer in a plan view.

The insulating layer may include a buffer layer, an interlayer insulating layer, and a protective layer, the first groove may be formed by removing all of the buffer layer, the interlayer insulating layer, and the protective layer, and the second groove may be formed by removing the protective layer.

The first grooves and the second grooves may be alternately disposed.

The metal layer and a gate conductive layer of the display area may be disposed on a same layer and may include a same material.

The display device may further include a thin film encapsulation layer disposed on the insulating layer. The thin film encapsulation layer may not be disposed on a part of an inner side of the groove.

The thin film encapsulation layer may be disposed on a side of the inner side of the groove and may not be disposed on another side of the inner side of the groove.

The thin film encapsulation layer may be formed in the display area and the non-display area, and the thin film encapsulation layer disposed in the non-display area and the thin film encapsulation layer disposed in the display area may not be connected with each other.

The mask support may include an organic material, and may include a via layer, the via layer and the insulating layer of the display area being disposed on a same layer, and a partitioning wall, the partitioning wall of the mask support and a partitioning wall of the display area being disposed on a same layer.

A display device according to an embodiment may include a substrate that comprises a display area and a non-display area; a mask support that is disposed in the non-display area of the substrate; a sealant that is disposed in the non-display area of the substrate and is disposed between the mask support and the display area; a metal layer that is disposed on the substrate and is disposed between the sealant and the mask support; an insulating layer that is disposed on the metal layer; and a plurality of grooves that are formed by removing at least a part of the insulating layer.

Areas where the plurality of grooves are formed and areas where the plurality of grooves may be not formed are alternately disposed.

The display device may further include a thin film encapsulation layer that is disposed on the insulating layer, wherein the thin film encapsulation layer may not be disposed on a part of an inner side of the groove.

The thin film encapsulation layer may be disposed in one side of the inner side of the groove and may not be disposed on another side of the inner side of the groove.

The thin film encapsulation layer may be formed in the display area and the non-display area, and the thin film encapsulation layer disposed in the non-display area and the thin film encapsulation layer disposed in the display area may not be connected with each other.

A method for manufacturing a display device according to an embodiment may include preparing a substrate that includes a display area and a non-display area where a plurality of mask supports are disposed; placing a mask on the mask support and depositing a thin film encapsulation layer material by a chemical vapor deposition method; cutting the substrate; forming an insulating layer that is disposed between the mask support and the display area; and forming a plurality of grooves by removing at least a part of the insulating layer. In the deposition of the thin film encapsulation layer material by the chemical vapor deposition method, the thin film encapsulation layer is not formed on a part of the plurality of grooves.

The thin film encapsulation layer may be disposed on a side of the inner side of the groove and may not be disposed on another side of the inner side of the groove.

The cutting of the substrate may include removing at least a part of areas where a part of the mask supports is disposed.

The manufacturing method of the display device may further include polishing an area adjacent to the cut plane after the cutting of the substrate.

The thin film encapsulation layer may be formed in the display area and the non-display area, and the thin film encapsulation layer disposed in the non-display area and the thin film encapsulation layer disposed in the display area may not be connected with each other.

According to the embodiments of the disclosure, a display device that can prevent propagation of cracks in cutting of the display device where a bezel is minimized in size can be provided.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
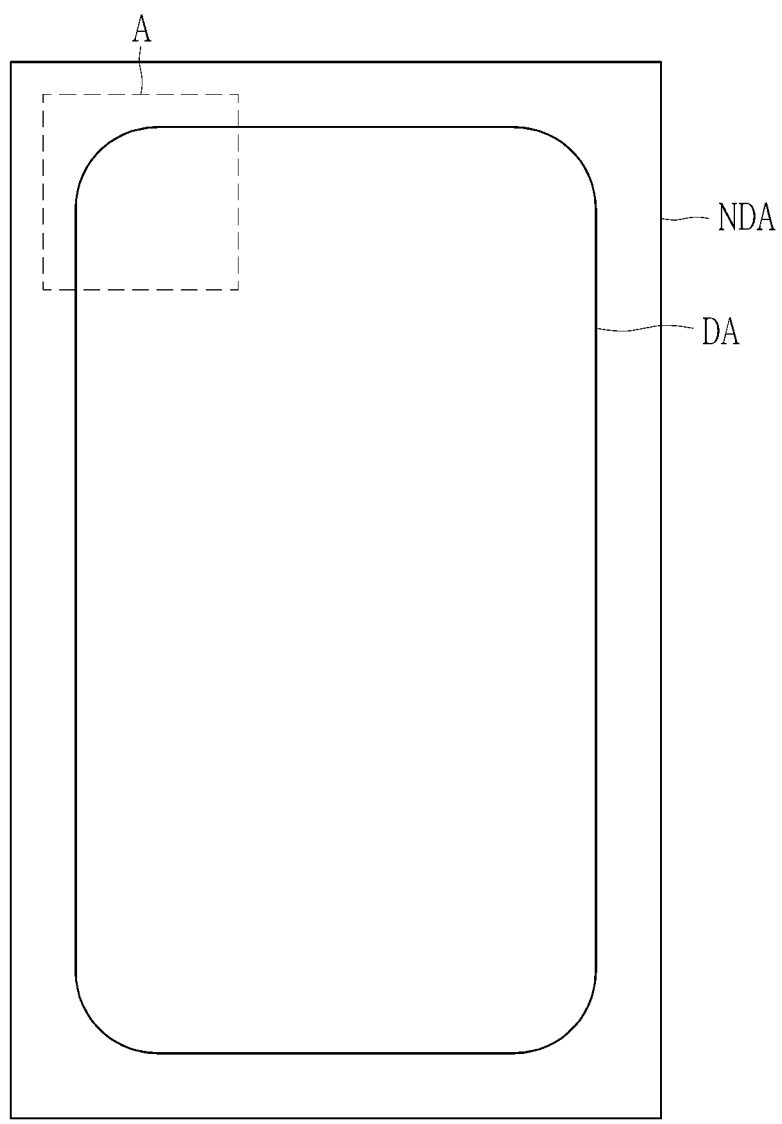
FIG. 1 a plan view schematically illustrating a configuration of a display device according to an embodiment.

The disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the disclosure.

The drawings and description are to be regarded as illustrative in nature and are not restrictive. Like reference numerals denote like elements throughout the specification.

In the drawings, size and thickness of each element are arbitrarily illustrated for convenience of description, and the disclosure is not necessarily limited to as illustrated in the drawings. In the drawings, the thicknesses of layers, films, panels, regions, etc., may be exaggerated for clarity. In addition, in the drawings, for better understanding and ease of description, the thicknesses of some layers and regions may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise," "include," or "have" and variations thereof will be understood to imply the inclusion of stated elements but not the exclusion of any other elements.

Further, throughout the specification, the phrase "on a plane" or "in a plan view" means viewing a target portion from the top, and the phrase "on a cross-section" means viewing a cross-section formed by vertically cutting a target portion from the side.

Figure 2:
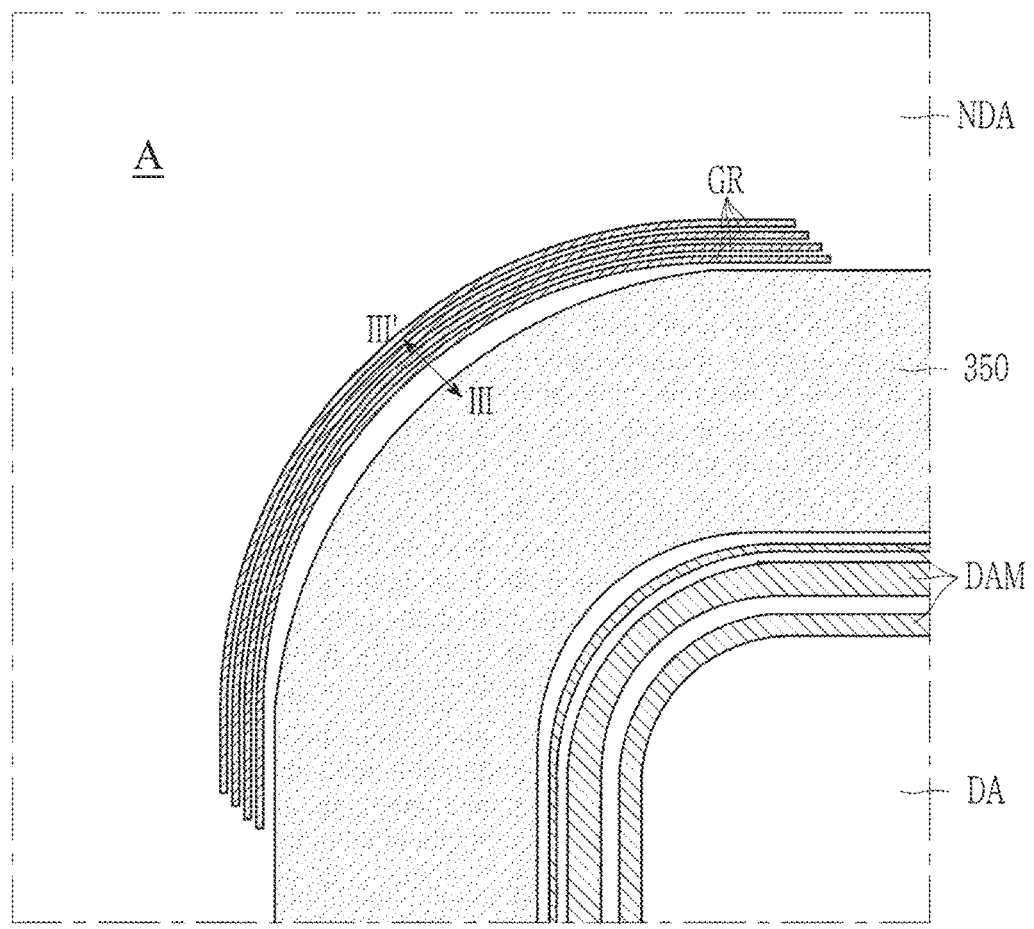
FIG. 2 an enlarged view schematically illustrating part A in FIG. 1 in detail.
Figure 3:
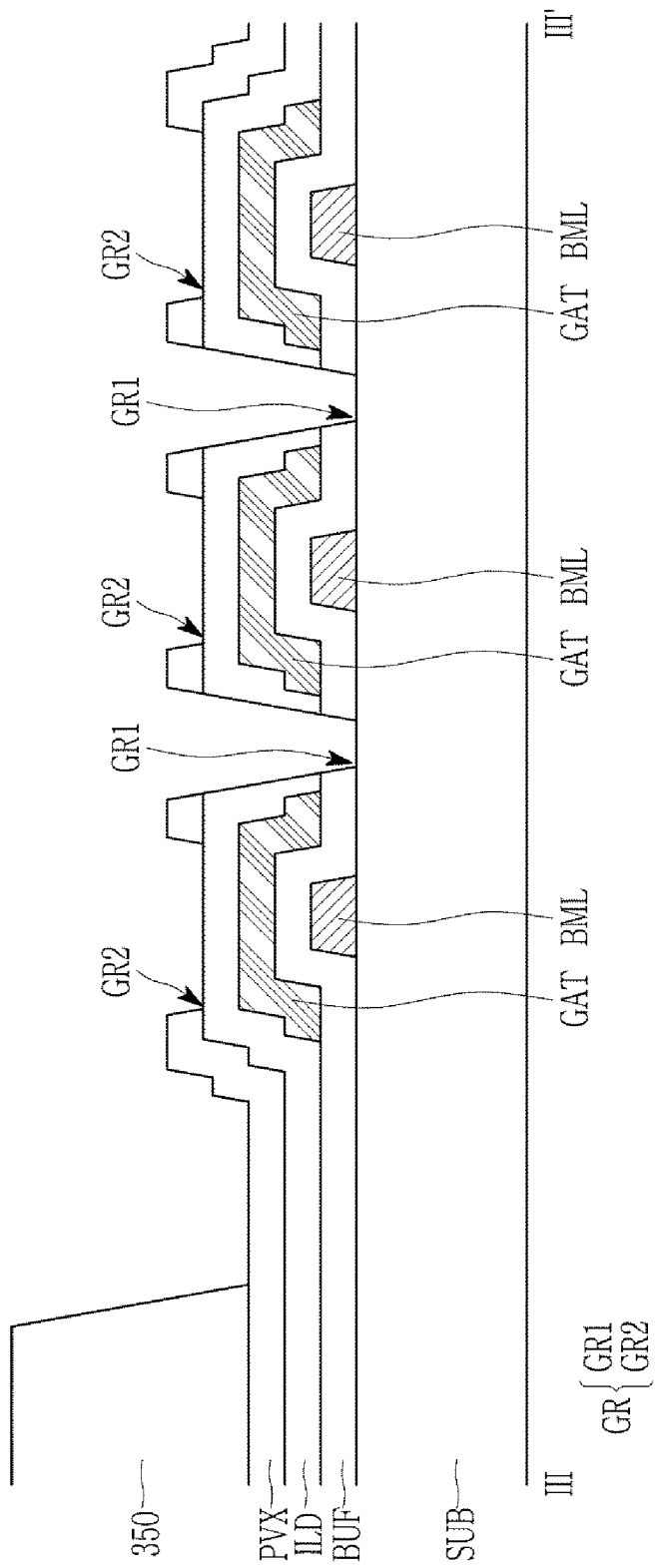
FIG. 3 is a schematic cross-sectional view of FIG. 2, taken along line III-III'.

Hereinafter, a display device according to the embodiment will be described with the accompanying drawings. FIG. 1 schematically illustrates a configuration of a display device according to an embodiment, and FIG. 2 schematically illustrates part A in FIG. 1 in more detail. FIG. 3 is a schematic cross-sectional view of FIG. 2, taken along line III-III'.

Referring to FIG. 1, a display device according to the embodiment includes a display area DA and a non-display area NDA. The display area DA is an area where pixels and the like are disposed and thus an image is displayed, and the non-display area NDA is an area where an image is not displayed.

FIG. 2 schematically illustrates part A in FIG. 1 in more detail. Referring to FIG. 2, dams DAM may be located adjacent to the display area DA. A sealant 350 may be disposed adjacent to the dams DAM. Grooves GR may be disposed adjacent to the sealant 350. The non-display area NDA located adjacent to the grooves GR may be a mask support that supports a mask used in a process. The grooves GR and the mask support may be grooves and mask support available in the art and will not be further described in detail.

FIG. 3 is a schematic cross-sectional view of FIG. 2, taken along line III-III'. Referring to FIG. 3, the display device according to the embodiment includes a substrate SUB, a light blocking layer BML disposed on the substrate SUB, a buffer layer BUF disposed on the light blocking layer BML, a gate conductive layer GAT disposed on the buffer layer BUF, an interlayer insulating layer ILD disposed on the gate conductive layer GAT, and a protective layer PVX disposed on the interlayer insulating layer ILD.

As shown in FIG. 3, the sealant 350 may be disposed on the protective layer PVX. In addition, as shown in FIG. 3, the display device according to the embodiment includes grooves GR. In this case, the grooves GR may include first grooves GR1 that are disposed without overlapping the gate conductive layer GAT and the light blocking layer BML in a direction that is perpendicular to the plane of the substrate SUB, and second grooves GR2 that are disposed overlapping the gate conductive layer GAT and the light blocking layer BML in the direction that is perpendicular to the plane of the substrate SUB.

In this case, the first groove GR1 and the second groove GR2 may have a width of about 0.1 µm to about 1 mm. In case that the width is less than about 0.1 µm, a manufacturing process may be substantially difficult, and in case that the width is more than 1 mm, the region of the non-display area becomes wide, which is not desirable. An interval between each groove may be about 0.1 µm to about 1 mm. In case that the interval is less than about 0.1 µm, a manufacturing process may be substantially difficult, and in case that the interval is more than about 1 mm, the region of the non-display area becomes wide, which is not desirable.

As shown in FIG. 3, the first groove GR1 may be formed without the buffer layer BUF, the interlayer insulating layer ILD, and the protective layer PVX, and may be located without overlapping the gate conductive layer GAT and the light blocking layer BML in a direction that is perpendicular to the plane of the substrate SUB. The second groove GR2 may be formed without the protective layer PVX, and may be located while overlapping the gate conductive layer GAT and the light blocking layer BML in the direction that is perpendicular to the plane of the substrate SUB. The first groove GR1 and the second groove GR2 may be formed by removing the inorganic layer, and specifically, may be formed by removing materials such as a $SiN_x$ and a $SiO_x$.

Grooves GR may be positioned outside the display area DA, for example, in the non-display area NDA in the display device according to the embodiment, and this will be described in detail below. The grooves GR prevent continuous formation of a thin film encapsulation layer formed on the non-display area NDA during the manufacturing process. A thin film encapsulation layer is also formed in the non-display area NDA by a plasma shadow during a CVD process for forming the thin film encapsulation layer of the display area DA, and cracks may be formed in the thin film encapsulation layer formed in the non-display area NDA during cutting of the display device. The crack in the thin film encapsulation layer of the non-display area NDA may be propagated to the thin film encapsulation layer in the display area DA, and thus an internal moisture permeation path is formed, thereby causing defects. However, in the display device according to the embodiment, the thin film encapsulation layer formed in the non-display area NDA is discontinuously formed because of the grooves GR, so cracks can be prevented from being propagated to the inside of the display area DA.

More effectively, in order to prevent propagation of cracks, the first groove GR1 and the second groove GR2 with different depths can be alternately disposed in a chessboard shape. In case that the first groove GR1 and the second groove GR2 are alternately disposed in such a way, crack propagation in all directions can be prevented.

The gate conductive layer GAT shown in FIG. 3 may be a guard ring for prevention of static electricity inflow to the display area DA. The guard ring can disperse static electricity inflow from the outside so that the pixels in the display area DA are not damaged by static electricity.

Figure 4:
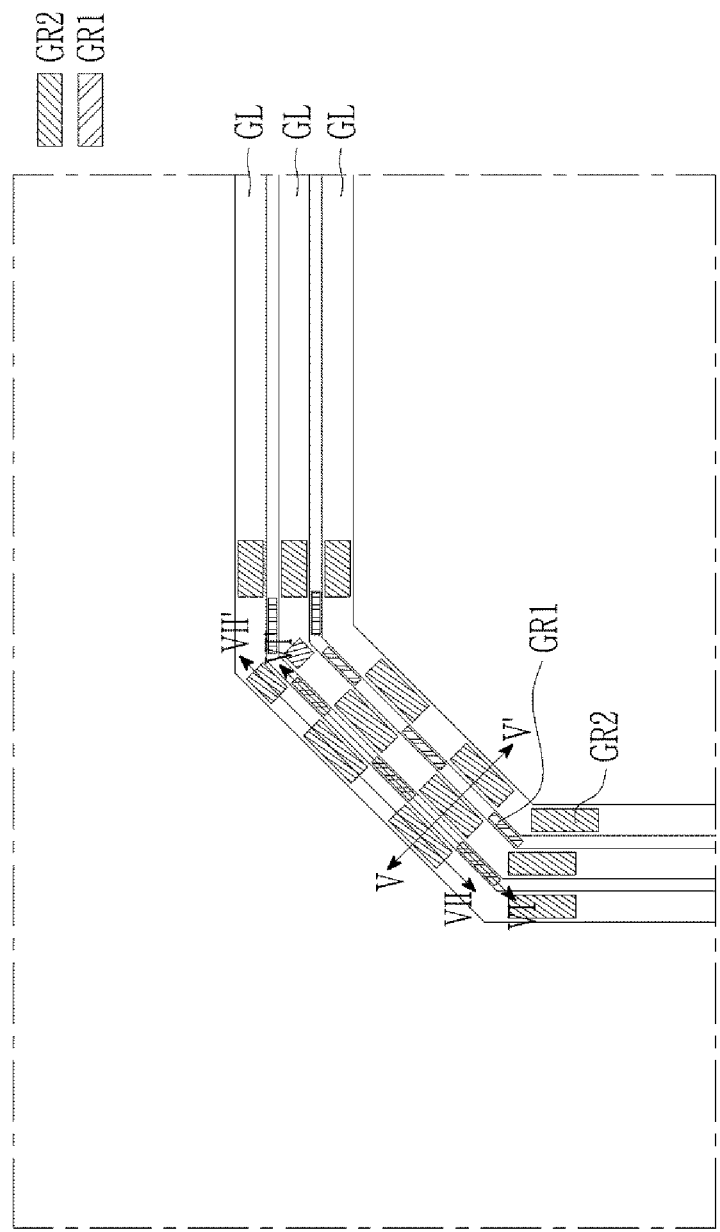
FIG. 4 is a diagram schematically illustrating a configuration of a guard ring GL and the grooves GR.

FIG. 4 is a diagram schematically illustrating a configuration of a guard ring GL and the grooves GR. In FIG. 4, guard rings GL are illustrated, and positions where the first groove GR1 and the second groove GR2 are formed are illustrated.

Figure 5:
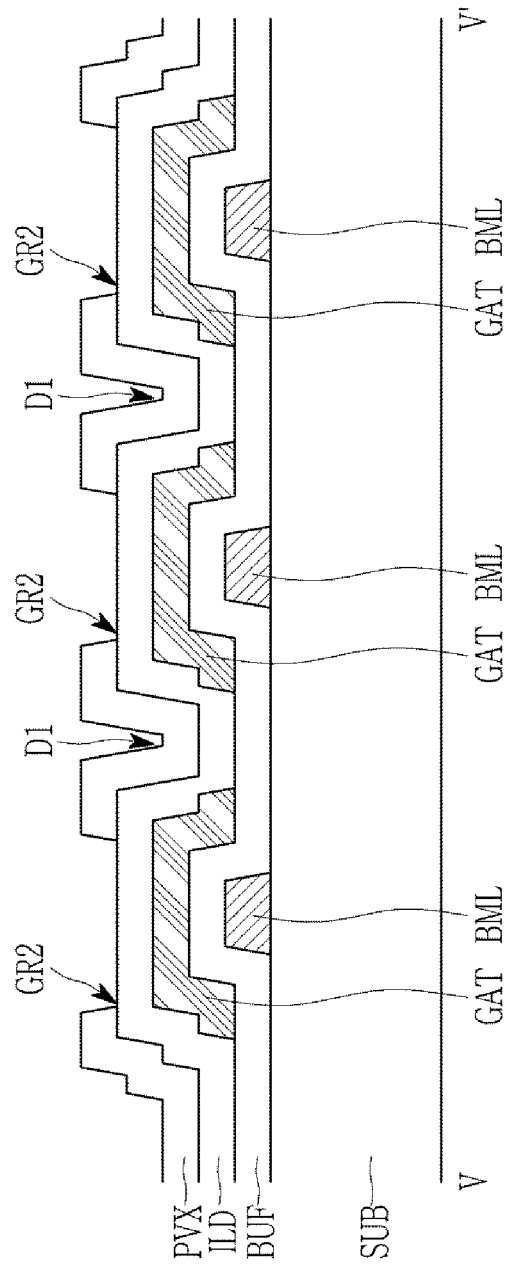
FIG. 5 is a schematic cross-sectional view of FIG. 4, taken along line V-V.

FIG. 5 is a schematic cross-sectional view of FIG. 4, taken along line V-V. Referring to FIG. 5, the substrate SUB, the light blocking layer BML disposed on the substrate SUB, the buffer layer BUF disposed on the light blocking layer BML, the gate conductive layer GAT disposed on the buffer layer BUF, the interlayer insulating layer ILD disposed on the gate conductive layer GAT, and the protective layer PVX disposed on the interlayer insulating layer ILD may be included.

The gate conductive layer GAT may form the guard ring GL. As shown in FIG. 5, the second grooves GR2 located overlapping the gate conductive layer GAT and the light blocking layer BML, in a direction that is perpendicular to the plane of the substrate SUB are included. The second grooves GR2 may be formed by removing the protective layer PVX.

In FIG. 5, an insulating layer is not removed in an area between neighboring second grooves GR2, but the gate conductive layer GAT and the light blocking layer BML are not disposed between the second grooves GR2 such that steps (or height differences) D1 may be formed. The step D1 may function as a groove such as the second groove GR2.

Figure 6:
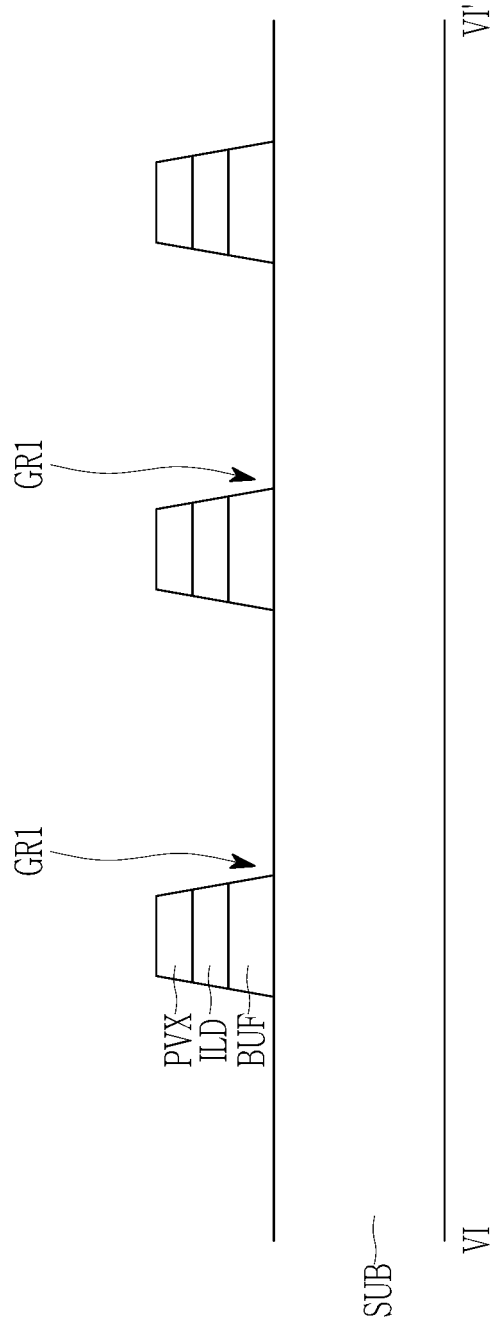
FIG. 6 is a schematic cross-sectional view of FIG. 4, taken along line VI-VI'.

FIG. 6 is a schematic cross-sectional view of FIG. 4, taken along line VI-VI'. Referring to FIG. 6, the buffer layer BUF, the interlayer insulating layer ILD, and the protective layer PVX are sequentially disposed on the substrate SUB. An area where the buffer layer BUF, the interlayer insulating layer ILD, and the protective layer PVX are removed becomes the first groove GR1. By the first groove GR1, a step is formed.

Figure 7:
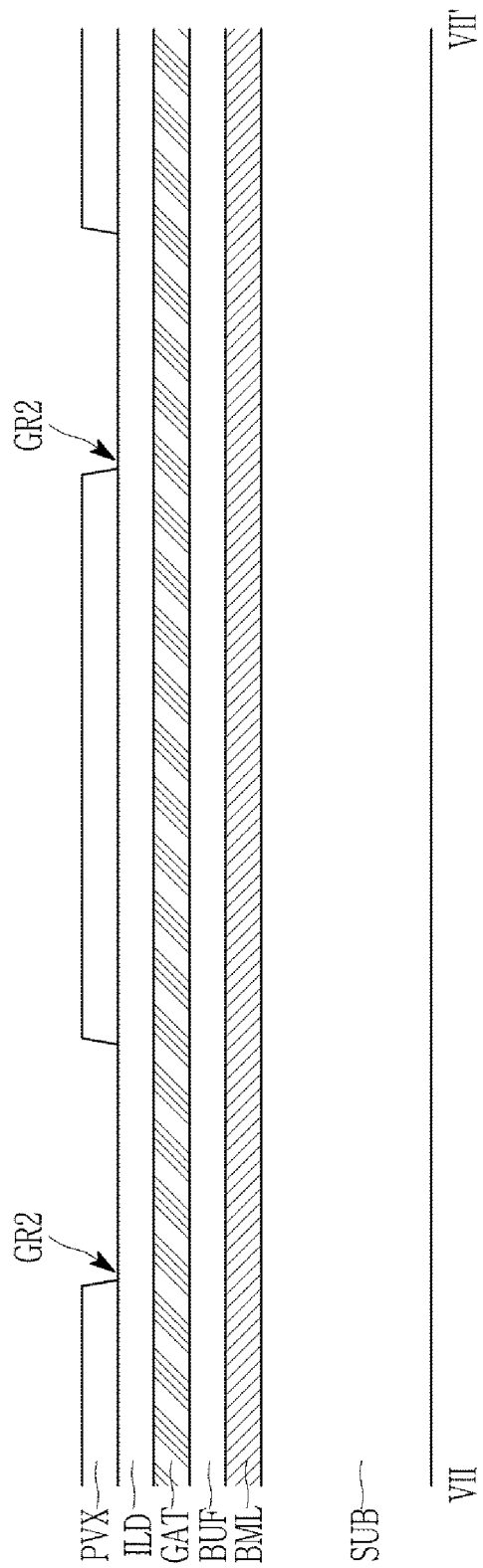
FIG. 7 is a schematic cross-sectional view of FIG. 4, taken along line VII-VII'.

FIG. 7 is a schematic cross-sectional view of FIG. 4, taken along line VII-VII'. Referring to FIG. 7, the light blocking layer BML disposed on the substrate SUB, the buffer layer BUF disposed on the light blocking layer BML, the gate conductive layer GAT disposed on the buffer layer BUF, the interlayer insulating layer ILD disposed on the gate conductive layer GAT, and the protective layer PVX disposed on the interlayer insulating layer ILD may be included. The protective layer PVX is partially removed such that the second groove GR2 is formed. Thus, a step is formed by the second groove GR2.

As shown in FIG. 4 to FIG. 7, the first grooves GR1 and the second grooves GR2 are formed alternately as in the shape of a chessboard. Accordingly, there is a step in the cross-section in any direction, and the propagation of the crack can be prevented by this step.

Figure 8:
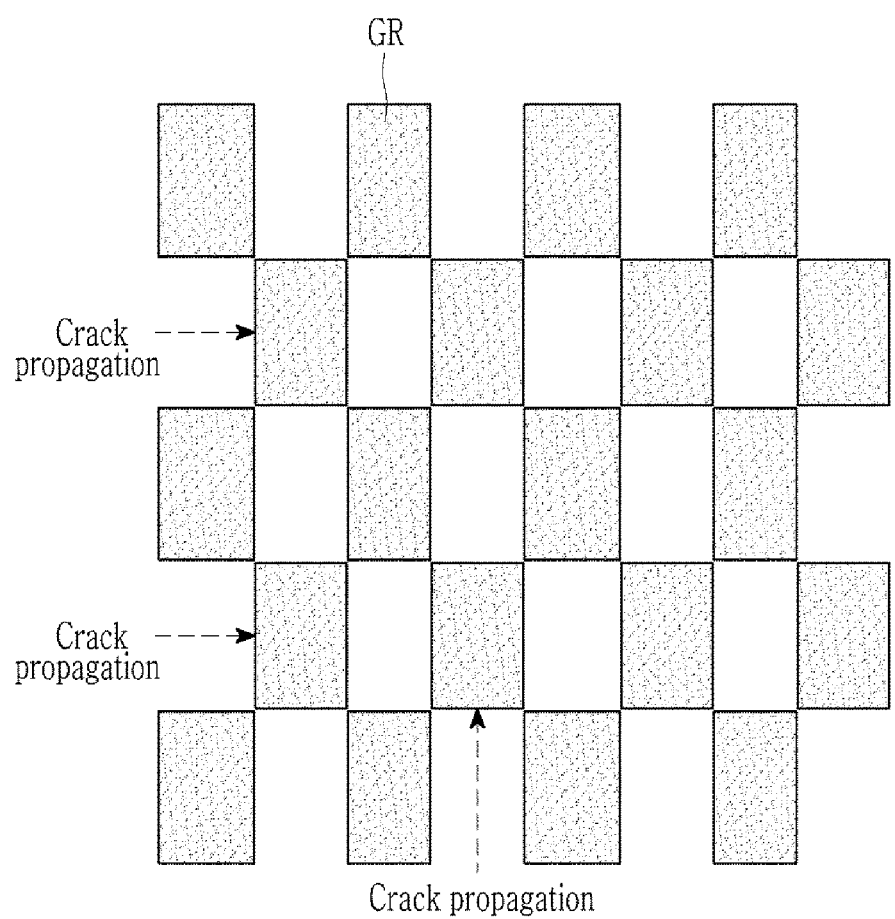
FIG. 8 schematically illustrates a configuration that suppresses crack propagation in case that the grooves GR are formed in the shape of a chessboard.

FIG. 8 schematically illustrates a configuration that suppresses crack propagation in case that the grooves GR are formed in the shape of a chessboard. As shown in FIG. 8, the crack propagation is blocked by the grooves GR. However, the disclosure is not limited thereto. For example, the grooves GR may be formed in a different shape among various shapes.

Figure 9:
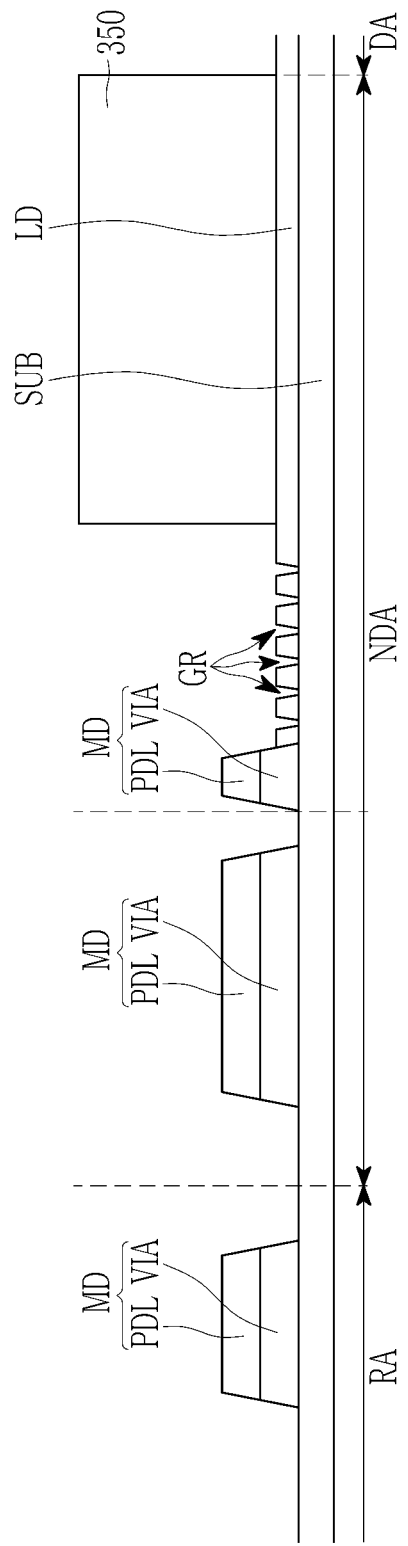
FIG. 9 illustrates a schematic cross-section of the display device according to an embodiment in more detail.

FIG. 9 illustrates a schematic cross-section of the display device according to the embodiment in more detail. FIG. 9 illustrates a cross-section at the outermost periphery of the non-display area NDA.

As shown in FIG. 9, the mask support MD is disposed on the substrate SUB. Multiple mask supports MD may be provided, and may have a stacked structure of a via layer VIA and a partitioning wall (or bank) PDL formed by the same processes as the display area DA. The substrate SUB may include the display area DA where an image is displayed, and the non-display area NDA where an image is not displayed, and a removal area RA removed after being manufactured. The mask supports MD may be disposed on the non-display area NDA and the removal area RA.

The sealant 350 may be disposed on the substrate SUB. The grooves GR are disposed in areas between the mask support MD and the sealant 350. The grooves GR may be formed by partially removing the insulating layer LD, and in FIG. 9, the groove GR is simply illustrated as the insulating layer LD, but in an embodiment, it may be a stacked structure including at least one of the buffer layer BUF, the interlayer insulating layer ILD, and the protective layer PVX.

In FIG. 9, a distance between the sealant 350 and the mask support MD may be about 100 μm. The corresponding region is a region in which grooves GR are disposed, and the length of the groove GR forming region may also be about 100 μm.

As shown in FIG. 9, in the display device according to the embodiment, the sealant 350 may be disposed closer to the display area DA than the mask support MD. This is a structure for reducing or minimizing the size of the bezel of the display device. For example, since the size of the bezel can be minimized as the sealant 350 is disposed in the space between the mask support MD and the display area DA, a separate margin for forming the sealant 350 is not required.

In the embodiment, the grooves GR may prevent crack propagation while being disposed between the mask support MD and the sealant 350. Hereinafter, the effect will be described in detail.

FIG. 10 to FIG. 14 schematically illustrate a formation process of a thin film encapsulation layer and a crack propagation in a display device that does not include grooves GR.

Figure 10:
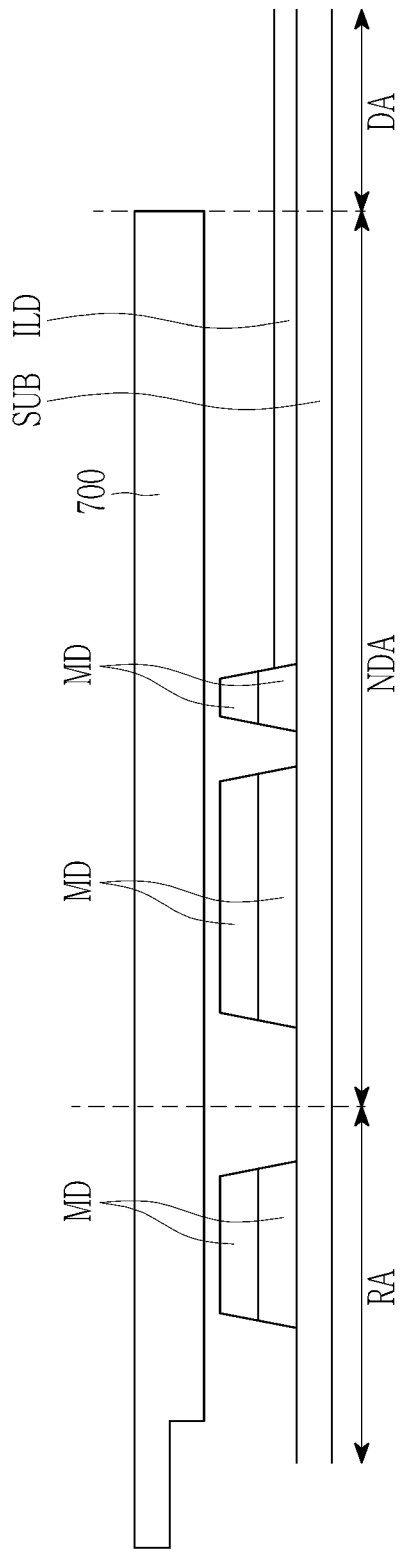
FIG. 10 to FIG. 14 schematically illustrate a formation process of a thin film encapsulation layer and a crack propagation in a display device that does not include grooves.

Referring to FIG. 10, a mask 700 is disposed on a mask support MD for forming a thin film encapsulation layer. The substrate SUB includes a display area DA, a non-display area NDA, and a removal area RA that is cut and removed during a manufacturing process. An interlayer insulating layer ILD may be disposed in the display area DA and the non-display area NDA of the substrate. For better comprehension and ease of description, only the interlayer insulating layer ILD is illustrated. In an embodiment, however, multiple wires and insulation layers may be disposed.

Figure 11:
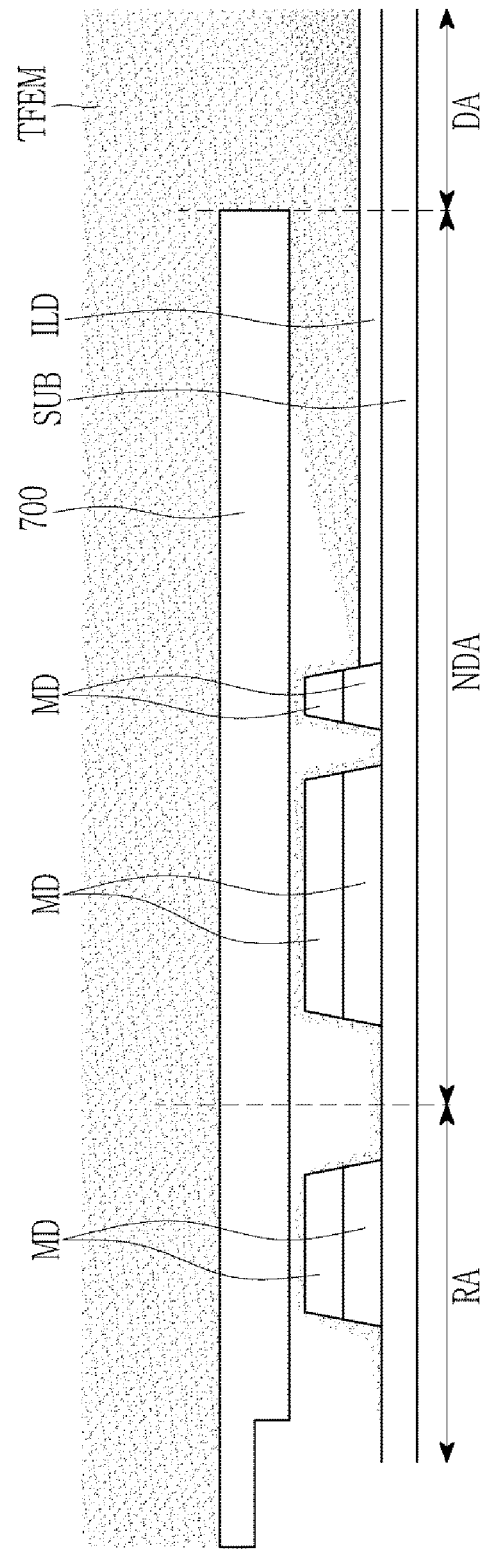

Next, referring to FIG. 11, a thin film encapsulation layer material TFEM is deposited by a chemical vapor deposition (CVD) method. In the deposition, plasma may be used.

Since the thin film encapsulation layer is deposited by plasma, as shown in FIG. 11, a plasma shadow is generated. Referring to FIG. 11, the deposition material is disposed even in an area covered or overlapped by the mask 700 by the plasma shadow.

Figure 12:
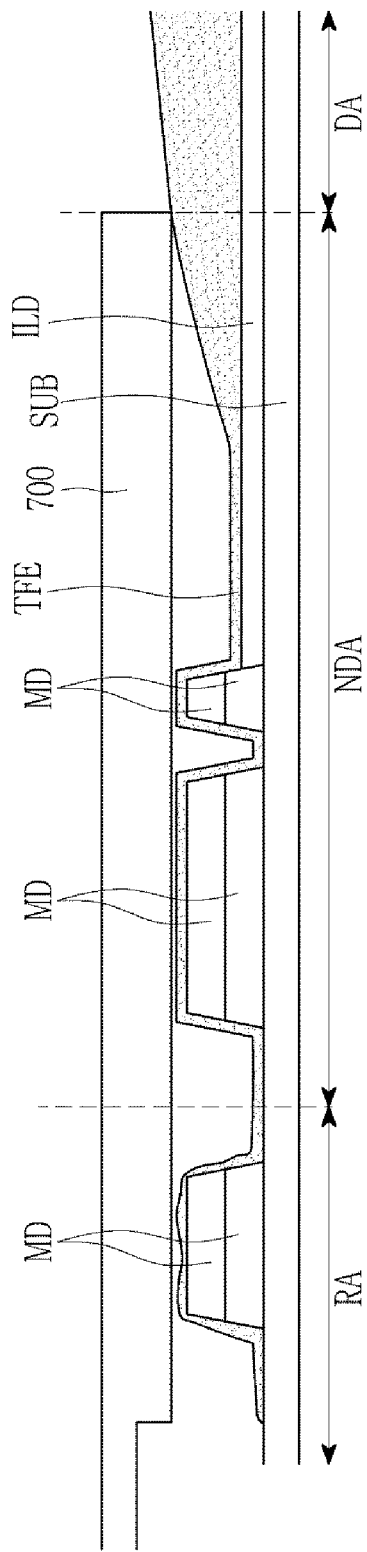

Thus, as shown in FIG. 12, a thin film encapsulation layer TFE is formed not only in the display area DA but also in the non-display area NDA and the removal area RA.

Figure 13:
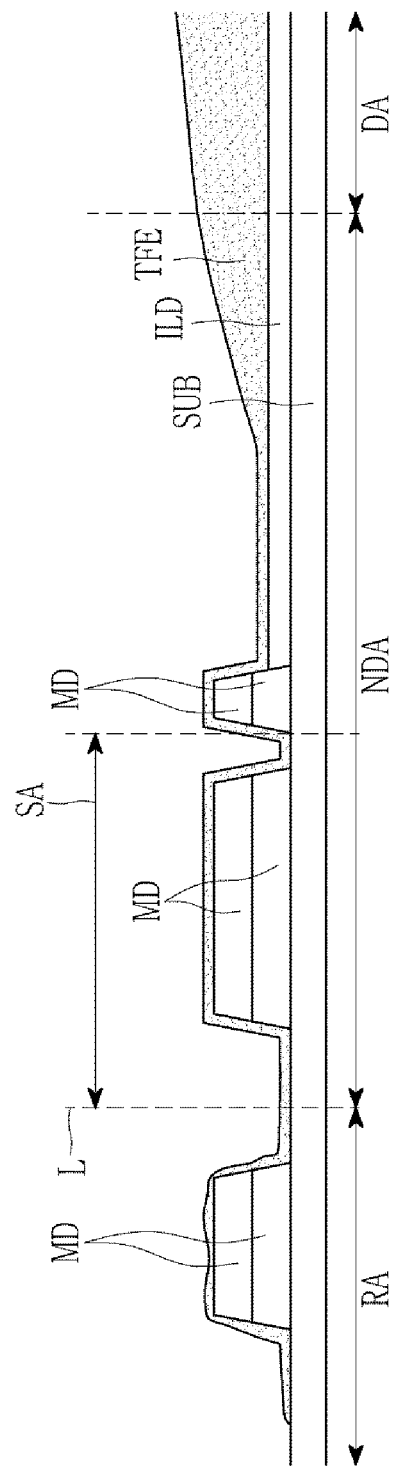
Figure 14:
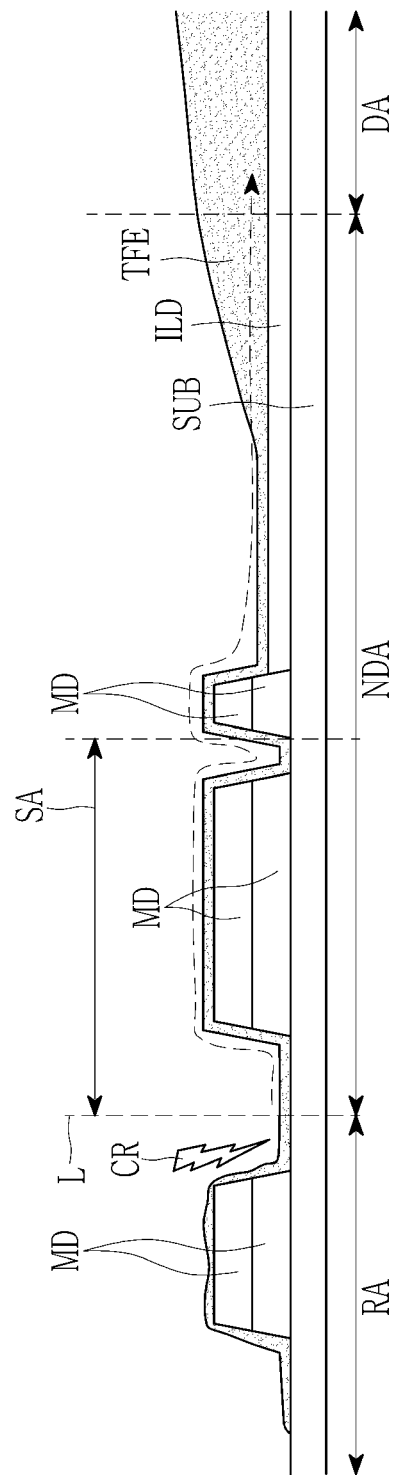

Referring to FIG. 13, the mask 700 and the removal area RA is removed. A cutting line L used in the cutting is illustrated in FIG. 13. As shown in FIG. 14, after removing the removal area RA through the cutting line L, a polishing process may be performed in a region adjacent to the cutting line L. A region in which such a polishing process is performed is indicated as a polishing area SA.

Referring to FIG. 14, in the process of removing the removal area RA through the cutting line L and the polishing process, a crack CR is formed in the previously formed thin film encapsulation layer TFE. This is because the impact in the removal process is also propagated to the thin film encapsulation layer TFE. In FIG. 14, a potential transmission path of the crack CR is illustrated as a dotted line.

As shown in FIG. 14, since the thin film encapsulation layer TFE is integrally formed in the removal area RA, the non-display area NDA, and the display area DA, the generated crack may be propagated to the display area DA. In case that a crack occurs in the thin film encapsulation layer TFE in the display area DA, moisture may penetrate and thus the reliability of the display device may be deteriorated.

However, in the display device according to the embodiment, the groove GR is disposed between the mask support MD and the display area DA, and thus crack propagation can be prevented by the groove GR.

Figure 15:
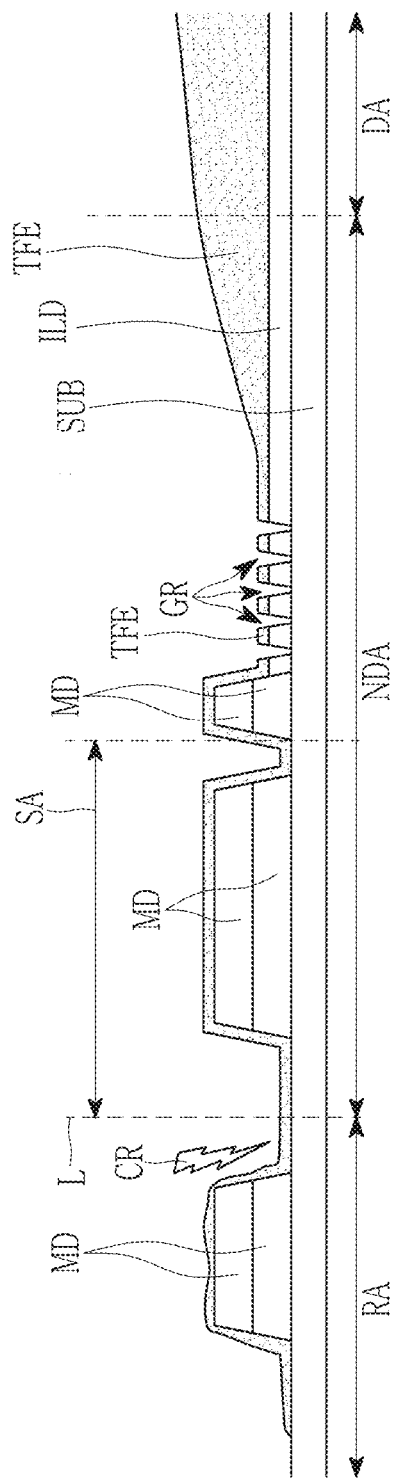
FIG. 15 schematically illustrates a principle of blocking the propagation of cracks in the thin film encapsulation layer TFE of the display device according to an embodiment.

FIG. 15 illustrates a principle of blocking the propagation of cracks in the thin film encapsulation layer TFE of the display device according to the embodiment.

As shown in FIG. 15, the propagation of the crack is blocked by the groove positioned between the mask support MD and the display area DA. This is because the plasma shadow has directionality. Because of the directionality of the plasma shadow, the thin film encapsulation layer TFE is not formed on the entire inner surface of the grooves GR, but may be partially formed on the inner surface of the grooves GR. Therefore, the thin film encapsulation layer TFE may be formed discontinuously or separately from each other and can block the propagation of cracks.

Figure 16:
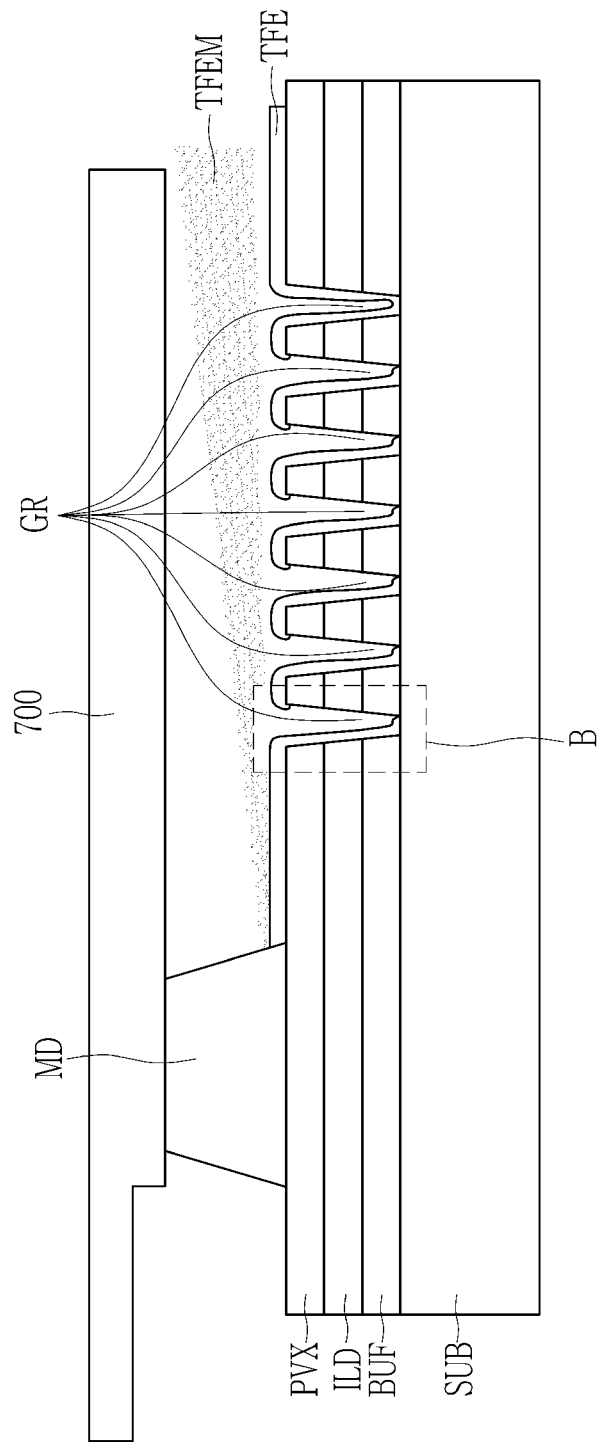
FIG. 16 schematically illustrates a principle of formation of the thin film encapsulation layer TFE in some of the grooves GR when the plasma shadow is formed.
Figure 17:
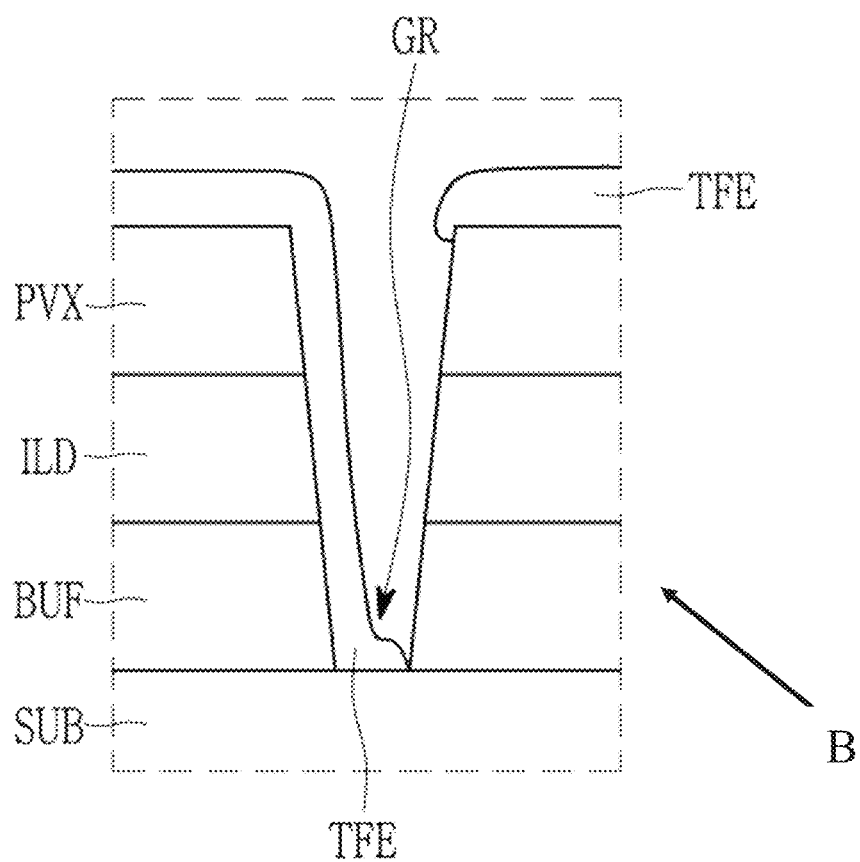
FIG. 17 is a schematic enlarged view of part B in FIG. 16.

FIG. 16 schematically illustrates a principle of formation of the thin film encapsulation layer TFE in some of the grooves GR when the plasma shadow is formed, and FIG. 17 is a schematic enlarged view of part B in FIG. 16. Referring to FIG. 16 and FIG. 17, when the thin film encapsulation layer is formed by the CVD process, the plasma shadow of the thin film encapsulation layer material TFEM has a direction. Therefore, the thin film encapsulation layer TFE may be deposited only on the wall of the grooves GR in the direction of the shadow progression, and the thin film encapsulation layer TFE is not deposited on the wall in the opposite direction of the progression direction.

Since the thin film encapsulation layer TFE is deposited only on a part of the wall and not on another part of the wall in grooves, the thin film encapsulation layer TFE 15 discontinuously deposited, and crack propagation in the cutting process can be prevented.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising:
   a substrate that includes a display area and a non-display area;
   a mask support that is disposed in the non-display area of the substrate;
   a sealant that is disposed in the non-display area of the substrate and is disposed between the mask support and the display area;
   an insulating layer that is disposed between the sealant and the mask support; and
   a plurality of grooves that are formed by removing at least a part of the insulating layer.

2. The display device of claim 1, further comprising a metal layer that is disposed between the insulating layer and the substrate.

3. The display device of claim 2, wherein the plurality of grooves comprise:
   first grooves that do not overlap the metal layer in a plan view; and
   second grooves that overlap the metal layer in a plan view.

4. The display device of claim 3, wherein
the insulating layer comprises:
- a buffer layer;
- an interlayer insulating layer; and
- a protective layer,
the first grooves are formed by removing all of the buffer layer, the interlayer insulating layer, and the protective layer, and
the second grooves formed by removing the protective layer.

5. The display device of claim 4, wherein the first grooves and the second grooves are alternately disposed.

6. The display device of claim 2, wherein the metal layer and a gate conductive layer of the display area are disposed on a same layer and include a same material.

7. The display device of claim 1, further comprising:
a thin film encapsulation layer disposed on the insulating layer, wherein
the thin film encapsulation layer is not disposed on a part of an inner side of each groove of the plurality of grooves.

8. The display device of claim 7, wherein the thin film encapsulation layer is disposed on a side of the inner side of each groove and is not disposed on another side of the inner side of each groove.

9. The display device of claim 7, wherein
the thin film encapsulation layer is formed in the display area and the non-display area, and
the thin film encapsulation layer disposed in the non-display area and the thin film encapsulation layer disposed in the display area are not connected with each other.

10. The display device of claim 1, wherein the mask support includes an organic material, and comprises:
- a via layer, the via layer and an insulating layer of the display area being disposed on a same layer, and
- a partitioning wall, the partitioning wall of the mask support and a partitioning wall of the display area being disposed on a same layer.

11. A display device comprising:
- a substrate that comprises a display area and a non-display area;
- a mask support that is disposed in the non-display area of the substrate;
- a sealant that is disposed in the non-display area of the substrate and is disposed between the mask support and the display area;
- a metal layer that is disposed on the substrate and is disposed between the sealant and the mask support;
- an insulating layer that is disposed on the metal layer; and
- a plurality of grooves that are formed by removing at least a part of the insulating layer.

12. The display device of claim 11, wherein areas where the plurality of grooves are formed and areas where the plurality of grooves are not formed are alternately disposed.

13. The display device of claim 11, further comprising:
a thin film encapsulation layer that is disposed on the insulating layer, wherein
the thin film encapsulation layer is not disposed on a part of an inner side of each groove of the plurality of grooves.

14. The display device of claim 13, wherein the thin film encapsulation layer is disposed on a side of the inner side of each groove and is not disposed on another side of the inner side of each groove.

15. The display device of claim 13, wherein
the thin film encapsulation layer is formed in the display area and the non-display area, and
the thin film encapsulation layer disposed in the non-display area and the thin film encapsulation layer disposed in the display area are not connected with each other.

16. A method for manufacturing a display device, comprising:
preparing a substrate that includes a display area and a non-display area where a plurality of mask supports and an insulating layer are disposed the insulating layer being disposed between the plurality of mask supports and the display area; forming a plurality of grooves by removing at least a part of the insulating layer;
placing a mask on the plurality of mask supports and the insulating layer and depositing a thin film encapsulation layer material on the plurality of mask supports and the insulating layer by a chemical vapor deposition method;
cutting the substrate,
wherein
in the deposition of the thin film encapsulation layer material by the chemical vapor deposition method, a thin film encapsulation layer is not formed on a part of the plurality of grooves.

17. The method for manufacturing the display device of claim 16, wherein the thin film encapsulation layer is disposed on a side of an inner side of each groove of the plurality of grooves and is not disposed on another side of the inner side of each groove.

18. The method for manufacturing the display device of claim 16, wherein the cutting of the substrate includes removing at least a part of areas where a part of the plurality of mask supports is disposed.

19. The method for manufacturing the display device of claim 16, further comprising:
polishing an area adjacent to a cut plane after the cutting of the substrate.

20. The method for manufacturing the display device of claim 16, wherein
the thin film encapsulation layer is formed in the display area and the non-display area, and
the thin film encapsulation layer disposed in the non-display area and the thin film encapsulation layer disposed in the display area are not connected with each other.

* * * * *